United States Patent [19]

Cox et al.

[11] 4,206,413
[45] Jun. 3, 1980

[54] DYNAMIC THRESHOLD TRANSIENT IMPULSE ENERGY INDICATOR

[75] Inventors: Philip P. Cox, Piscataway; Edward R. Fix, Old Bridge, both of N.J.

[73] Assignee: Dranetz Engineering Laboratories, Inc., So. Plainfield, N.J.

[21] Appl. No.: 879,233

[22] Filed: Feb. 21, 1978

[51] Int. Cl.² ............... G06G 7/18; G01R 19/00
[52] U.S. Cl. ..................... 328/127; 307/353; 324/102
[58] Field of Search ............ 324/102, 103 P, 103 R, 324/52, 133, 111, 112; 328/127, 128; 307/230, 228, 353

[56] References Cited

U.S. PATENT DOCUMENTS

| | | | |
|---|---|---|---|
| 3,225,213 | 12/1965 | Hinrichs et al. | 324/103 P |
| 3,412,330 | 11/1968 | Klaver | 324/103 P |
| 3,662,380 | 5/1972 | Cargile | 324/112 |
| 3,816,815 | 6/1974 | Schumann | 324/112 |

*Primary Examiner*—Ernest F. Karlsen

[57] ABSTRACT

A circuit for indicating the approximate energy content of the most significant transient appearing on an electrical power line within a predetermined interval is disclosed. An input to a first threshold comparator (326) may be set by the user to mark the nominal minimum amplitude ($V_2$) of voltage transient whose energy content (volt-second area) is to be recorded. The transient impulse voltage integrator (401) is turned on when the impulse amplitude exceeds a preliminary threshhold ($V_1$) lower than the nominal amplitude ($V_2$) under control of a second comparator (325) and flip-flop (423). When the transient impulse amplitude equals the nominal amplitude ($V_2$), a latch (431) reading a digital converter (430) at the output of the integrator (401) is clocked to permit display of the accruing integrator. While the integration proceeds the threshold of the second comparator (325) is increased from $V_1$ to $V_1'$ in accordance with the peak value attained by the voltage impulse and the comparator (325) turns off the integrator (401) when the transient impulse amplitude falls below $V_1'$ rather than $V_1$. This earlier turn-off prevents the integrator from responding to "trailing ringing" transients.

2 Claims, 7 Drawing Figures

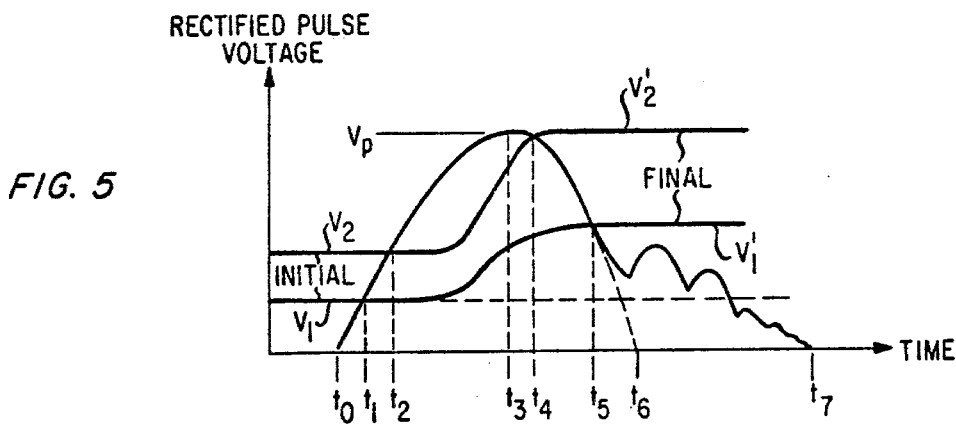
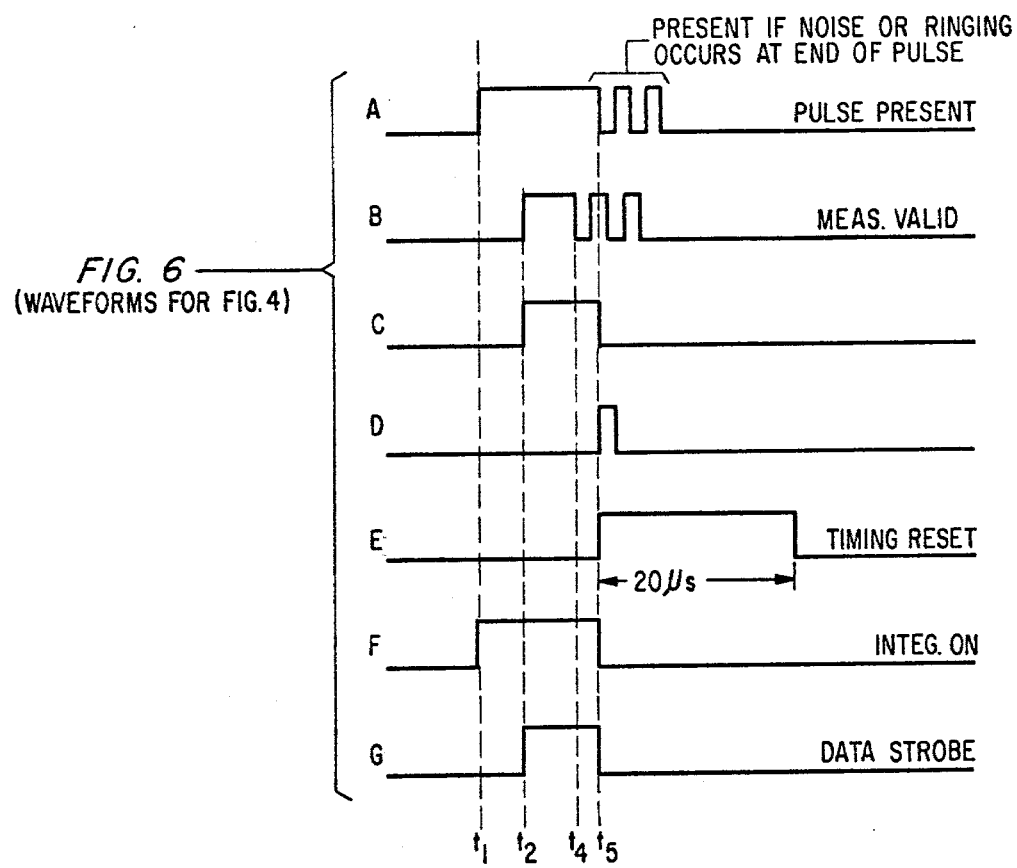
FIG. 5
FIG. 6 (WAVEFORMS FOR FIG. 4)
FIG. 7

DYNAMIC THRESHOLD TRANSIENT IMPULSE ENERGY INDICATOR

BACKGROUND OF THE INVENTION

This invention relates to power line disturbance analysis and more particularly to arrangements for reporting the most significant transient impulses occurring within a predetermined monitoring interval.

Equipment for reliably indicating parameters of line voltage disturbances has, however, heretofore been made widely available. For example, it has for some time been practical to monitor 60 Hz mains and to record the time of occurrence and the peak value of a transient impulse, the number of cycles of the mains frequency during which a line voltage sag or surge persisted, and the slow-averaged RMS level of the line voltage. Instruments are avaliable which have the ability to store data concerning a limited number of transients that may occur while the outprinting equipment is operating, and when the capacity of this temporary memory is exceeded, to printout a summary count of the number of excess transients and of the highest amplitude reached by any of the excess transient disturbances. The Dranetz Engineering Laboratories' Model 606 "Power Line Disturbance Analyzer" is an example of such presently available equipment.

While instruments which record the occurrence of significant transient disturbances by indicating those of highest amplitude in the monitoring interval are indeed useful, it is apparent that not all high amplitude disturbances may exhibit sufficient energy content to be of importance. As is well-known, the energy content of a voltage impulse, for example, is a function not only of amplitude but of time duration as well. The volt-second "area" of a transient impulse is therefore an approximate indication of the energy content of the voltage disturbance. Readily available operational amplifiers which perform an integration operation may accordingly conveniently be employed to indicate the volt-second area of impulses of various types.

The incorporation in power line disturbance analyzing equipment of an operational amplifier to indicate impulse energy content, while obviously useful for the foregoing reason, does, however, pose certain problems. It would, of course, be desirable to provide some minimum amplitude threshhold below which transient impulses could be ignored and, as disclosed in the co-pending application of P. P. Cox entitled "Dynamic Threshhold Impulse Directivity Indicator" Ser. No. 879,234 filed of even date herewith, it may be advantageous in transient analyzing circuits to increase the nominal or user-set threshhold in accordance with the peak magnitude actually exhibited by a prior pulse occuring in the monitoring interval so that only pulses of greater amplitude, if any should thereafter occur in the interval, will be recorded.

While increasing the threshhold in this manner is effective to screen out all but the largest impulse of interest it is equally to be desired to avoid the "over-reporting" of such an impulse. Unfortunately, high amplitude transients sometimes induce a ringing effect in the power line which persists after the initiating transient has subsided. It would be advantageous to discriminate against reporting the volt-seconds "area" of the trailing ringing pulses.

SUMMARY OF THE INVENTION

We have discovered that a more complete and meaningful record of the volt-seconds area of a transient disturbance appearing on a power line may be made by employing preliminary and validating turn-on threshholds and an enhanced turn-off threshhold in conjunction with an operational amplifier connected as a voltage integrator. In the illustrative embodiment, the validating threshhold $V_2$ is user-set to the nominal value below which impulse disturbances will not be finally reported. However, corresponding to the setting of the validating threshhold $V_2$, a lower preliminary threshhold $V_1$ is automatically established. When the impulse reaches threshhold $V_1$, the operational integrating amplifier is enabled and when the impulse reaches threshhold $V_2$, an output latch reading the output of the integrator is clocked. The latch continues to respond to the accruing integration until the initial transient impulse decays to a level $V_1'$ which is the preliminary threshhold $V_1$ enhanced by a fraction of the peak value $V_p$ attained by the transient. Thus, the integrator is turned off "earlier" at $V_1'$ rather than later at $V_1$. This earlier turn-off avoids the effects that a "ringing" transient voltage would have since the trailing portion of a ringing transient which often accompanies a large magnitude voltage transient might otherwise keep the integrator in an ON state after the main peak of the transient had passed. For many purposes, it is the energy content or volt-second area of only the main peak disturbance that is of interest.

DESCRIPTION OF THE DRAWING

The foregoing and other objects and features of the invention will become more apparent from the ensuing detailed description and drawing in which:

FIG. 5 shows the relationship among the preliminary, the nominal or validating and the enhanced preliminary and validating threshholds $V_1$, $V_2$, $V_1'$, and $V_2'$, respectively, in terms of the peak value $V_p$ of a transient voltage disturbance;

FIG. 6 shows waveforms occurring at certain indicated points in FIG. 4; and

FIG. 7 shows how FIGS. 1–4 are to be arranged.

GENERAL DESCRIPTION

Figure 1:
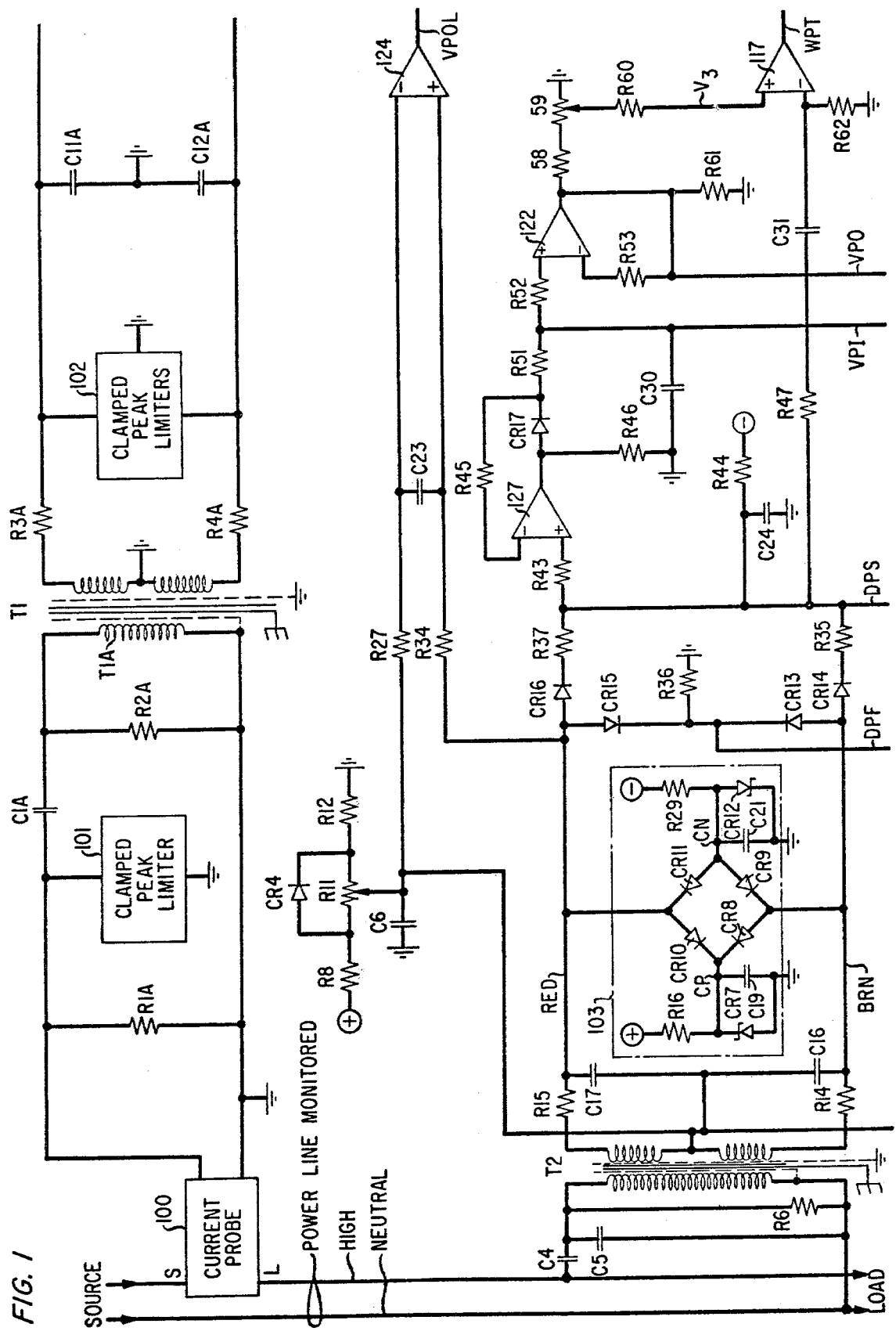
FIG. 1 shows the power line and voltage-impulse sensing circuitry of the illustrative embodiment.

Referring to FIG. 1, there is shown the circuitry associated with the current and voltage inputs. The current input circuit shown at the upper portion of FIG. 1 includes an input transformer T1 and clamped peak limiters 101 and 102. The current probe is a clamp-on device which may be installed without disconnection of the power line to be monitored. This connection effectively places resistor R1A "in series" with the power line on which transients are to be monitored. The current probe scales its output down by a large factor to a level convenient to be applied to register R1A. Accordingly, a transient voltage will be applied to the primary winding T1A of transformer T1 which is proportional to the magnitude of any current transient appearing on the power line in question. The magnitude of this transient voltage is limited to avoid injuring the electronic apparatus of the illustrative embodiment by a clamped peak limiter 101 connected between ground and capacitor C1A at the upper end of the primary winding of transformer T1 and clamped peak limiters 102 connected from resistors R3A and R4A to ground. Peak limiter 101 may comprise any well-known diode limiting arrangement and may simply comprise a pair of serially connected diodes (not shown) returned to opposite-polarity clamping voltages and connected at their common junction point to the aforementioned capacitor C1A at the upper end of the primary winding of transformer T1. Advantageously, the diodes in limiter 101 may be designed for higher current carrying capacity than the diodes included in limiters 102.

Limiters 102 may advantageously be of the same form as clamped peak limiter 103 shown in detail at the secondary of voltage transient transformer T2. In addition, where limiter 102 is of the same form as limiter 103, the serially connected diodes (not shown) of peak limiter 101 may advantageously be returned to the clamped, opposite voltage points of peak limiter 102 comparable to the clamped, opposite voltage points CP, CN shown at the junction of each Zener diode and its respective current supply resistor in limiter 103. C1A, R2A and T1A comprise a high pass filter circuit which rejects line power frequencies, typically 50 or 60 Hz, while passing the frequency range of the impulse type disturbances to be analyzed. R3A, R4A, C11A, and C12A comprise a low pass filter which rejects impulse frequencies too high, typically above 1 MHz, for the circuits of the illustrative embodiment to accurately process.

Figure 2:
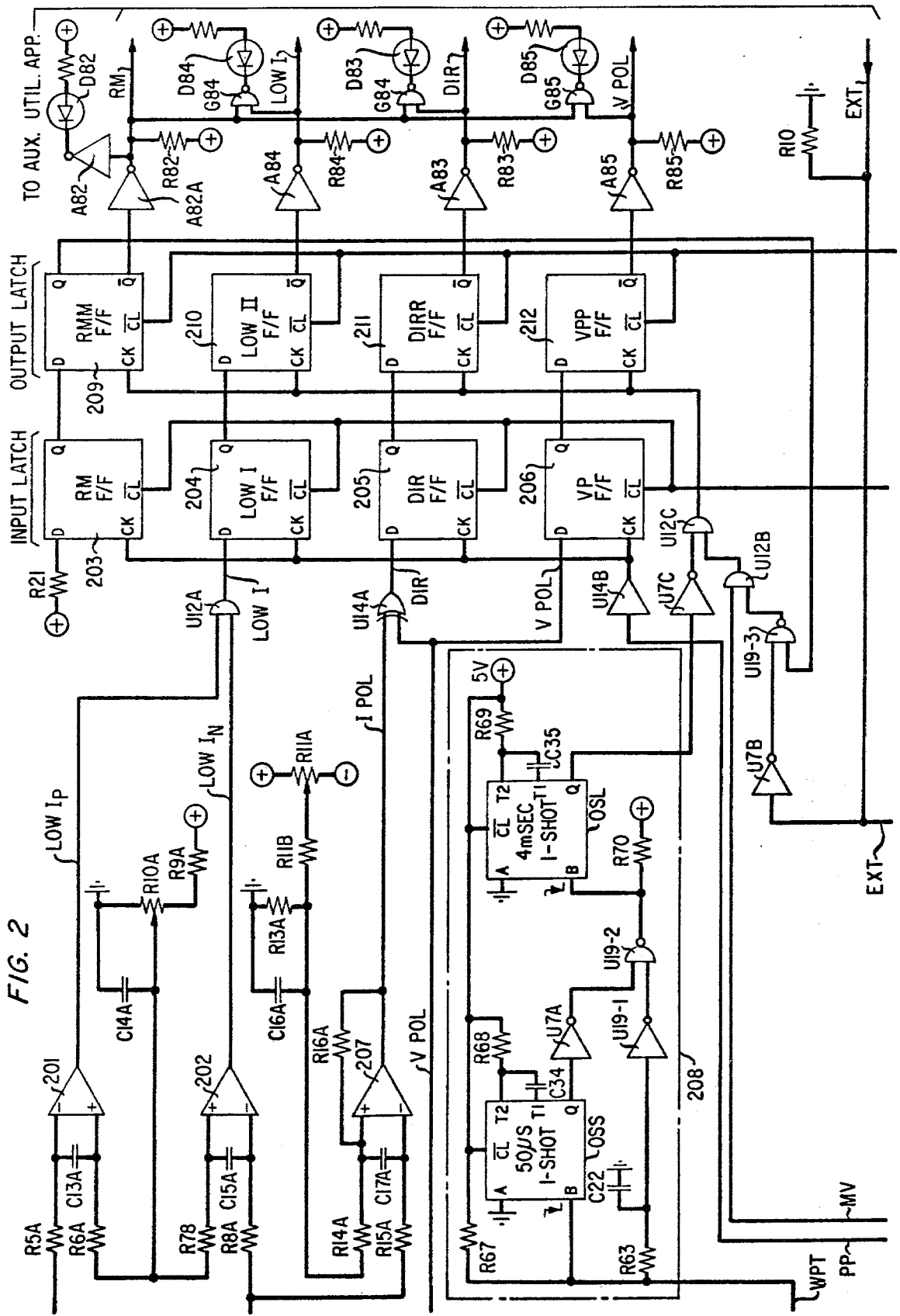
FIG. 2 shows circuitry for registering transient polarities and directivity.

The clamped, limited output voltages developed across the secondary windings of current input transformer T1 are applied to the upper input of comparator 201, FIG. 2, and to the lower input of comparator 202. The other inputs of comparators 201 and 202 are each connected to the slider of low limit adjusting potentiometer R10A. If either polarity of the current transient sensed by the transformer T1 is lower in absolute magnitude than the voltage to which potentiometer R10A is adjusted, lead LOWI$_p$ or lead LOWI$_N$, respectively, will be placed in the "1" state by the output of comparators 201 or 202, respectively. A "1" signal on both of these leads will cause AND gate U12 to apply a "1" signal to the D input of low current indicating flip-flop 204.

Flip-flop 204 is one of a bank of four D-type flip-flops 203 through 206 comprising an input latch. A D-type flip-flop is a flip-flop which will transfer the signal state presented at its D input to its Q output when the flip-flop is clocked by the application of an appropriate signal to its CK input. The setting of low current indicating flip-flop 204 indicates that the magnitude of the current transient lies within the band of ±n amperes. Such an indication may be employed by a power line disturbance analyzer having a paper tape printer (not shown but assumed to be connected at the right-hand side of FIGS. 2 and 4). Such an output indicating device may advantageously be the Series 606 "Power-Line Disturbance Analyzer" manufactured by Dranetz Engineering Laboratories, Inc.

The voltage developed across the secondary winding of current input probe transformer T1 is also applied to the lower input of current polarity comparator 207. Capacitor C17A is connected across the inputs of comparator 207 (and capacitors C13A and C15A are connected across the inputs of comparators 201 and 202, respectively) to limit the response of the comparator to transients having at least a minimum time duration. In the illustrative embodiment, for example, it is desired to ignore pulses having a time duration less than approximately one-half microsecond. The upper input of comparator 207 is connected to the slider of current polarity offset potentiometer R11A. The output of comparator 207 is connected to the upper input of exclusive-OR gate U14A, the lower input of which, as will hereinafter be more fully explained, is connected to receive an input determined by the polarity of the voltage transient. Exclusive-OR gate U14A correlates the transient polarities applying a high signal to the D input of transient direction indicating flip-flop 205 if either, but not both of leads IPOL or VPOL exhibits the "1" signal state.

Returning now to FIG. 1, there is shown at the lower left-hand portion thereof the circuitry associated with the voltage transient input. The primary winding of transformer T2 is connected across the power line through a capacitive voltage divider formed by C4 and C5 to receive any input voltage transient appearing thereon. C5, R6 and T2 comprise a high pass filter circuit which rejects line power frequencies, typically 50 or 60 Hz, while passing the frequency range of the impulse type disturbances to be analyzed. R15, R14, C16 and C17 comprise a low pass filter which rejects impulse frequencies too high, typically above 1 MHz, for the circuits of this embodiment of the invention to accurately process.

The voltage developed across the secondary of transformer T2 is applied to clamped peak limiter 103. When the transient appearing at the secondary winding of transformer T2 is in the positive direction, diode CR10 is forward-biased and clamps the upper-most lead "RED" to the voltage determined by Zener diode CR7. When the upper-most lead "RED" responds to a negative voltage transient, diode CR11 conducts and clamps lead RED to the negative voltage determined by Zener diode CR12. Similarly, diode CR8 conducts when lead BRN experiences a positive transient and diode CR9 conducts when lead BRN experiences a negative transient.

The polarity of the voltage transient appearing on lead RED is sensed by comparator 124 whose + and − inputs are connected, via resistors R34 and R37, to lead RED and the center tap of the secondary of transformer T2. Lead VPOL at the output of comparator 124 is continued into FIG. 2 where it is connected to the lower input of exclusive OR gate U14A and to the D input of voltage polarity indicating flip-flop 206.

Positive voltage transients appearing on leads RED and BRN, respectively, in FIG. 1, are applied through diodes CR15 and CR13, respectively, to lead DPF at the left end of resistor R36 developing thereacross a potential difference at the moment of transient occurrence. Lead DPF is continued into FIG. 3 where it is connected via resistor R31 to the upper input of pulse presence detecting comparator 325 and into FIG. 4 where it is connected to volt-second integrating circuitry 401.

Figure 3:
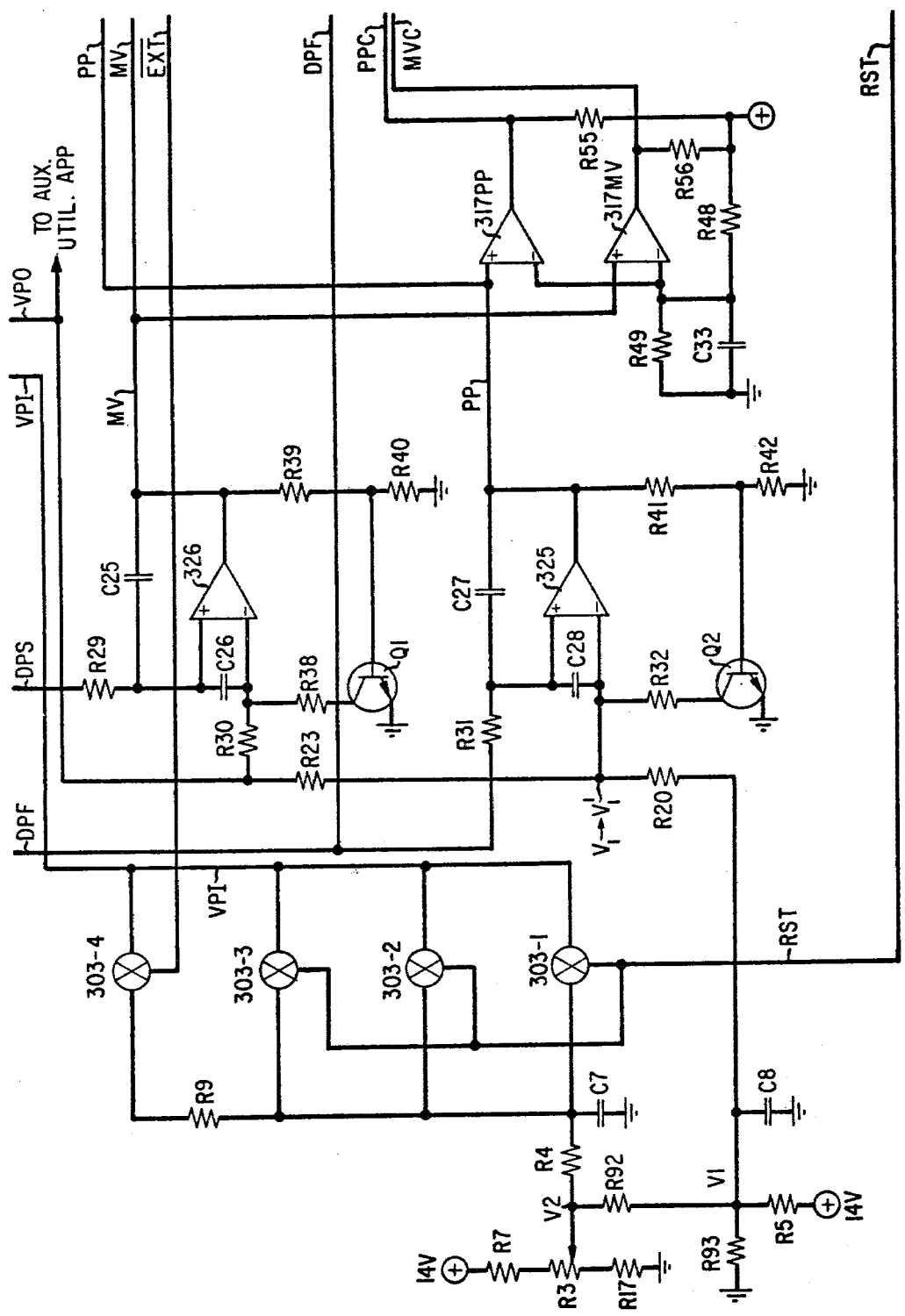
FIG. 3 shows the comparators for determining the preliminary and validating turn-on threshholds and the enhanced turn-off threshhold.

In FIG. 3, comparator 325 senses, at its upper input terminal, the presence of a transient impulse on lead DPF and, at its lower input terminal, a threshhold voltage $V_1$ determined in part by the setting of external threshhold setting control R3 and in part by the fixed voltage divider comprising R92 and R93. Advantageously, the fixed divider R92-R93 delivers to the lower input terminal of comparator 325 a voltage which is approximately one-half the voltage developed at the slider of threshhold setting control R3. Resistor R5 feeds a small, relatively constant current to the junction of R92 and R93. This current causes $V_1$ to become a higher percentage of $V_2$ as lower values of $V_2$ are selected. This is necessary to correct for peak detector low level non-linearity which will subsequently be discussed. When the transient voltage appearing on lead DPF exceeds the threshhold voltage $V_1$, comparator 325 applies a "1" signal to lead PP. (See time $t_1$ in FIG. 5 and line A of FIG. 6).

Returning to FIG. 1, positive voltage transients appearing on leads RED and BRN, respectively, are applied through diode CR16 and resistor R37, and through diode CR14 and resistor R35, respectively, to lead DPS and capacitor C24 at its junction with resistor R44. The signal developed on lead DPS is forwarded via resistor R43 to the lower input of operational amplifier 127 which commences to charge capacitor C30 to the peak value of the signal through diode CR17 and resistor R51. The peak value of the voltage on capacitor C30 is applied via buffer amplifier 122 to lead VPO.

The signal developed on lead DPS is also continued in FIG. 1 via resistor R47 and capacitor C31 to the lower input of comparator 117 and, in FIG. 3, via resistor R29 to the upper input of measurement validating comparator 326. The lower input of comparator 326 is connected via resistor R30 to lead VPO. Resistors R23 and R20 are a voltage divider which adds a portion of the VPO level to $V_1$ and applies the resultant voltage to the lower input of comparator 325. The purpose of resistors R23 and R20 will be hereinafter more fully explained.

Comparator 325 initially senses the difference between the preliminary voltage threshhold $V_1$ and the magnitude of the incident voltage transient appearing on lead DPF. Comparator 326 initially senses the difference in potential between the signals appearing upon leads VPO and DPS.

The apparatus detailed in FIGS. 1 through 4 is advantageously to be used with an auxiliary utilization and indicating apparatus which advantageously may take the form of the aforementioned model 606 Power Line Disturbance Analyzer. In addition, output leads RM, DIR, LOWI, and VPOL in FIG. 2 may be connected via conventional driver circuitry (not shown) to each operate a simple neon bulb display lamp or, as hereinafter described, a respective one of light-emitting diodes D82 through D85.

Figure 4:
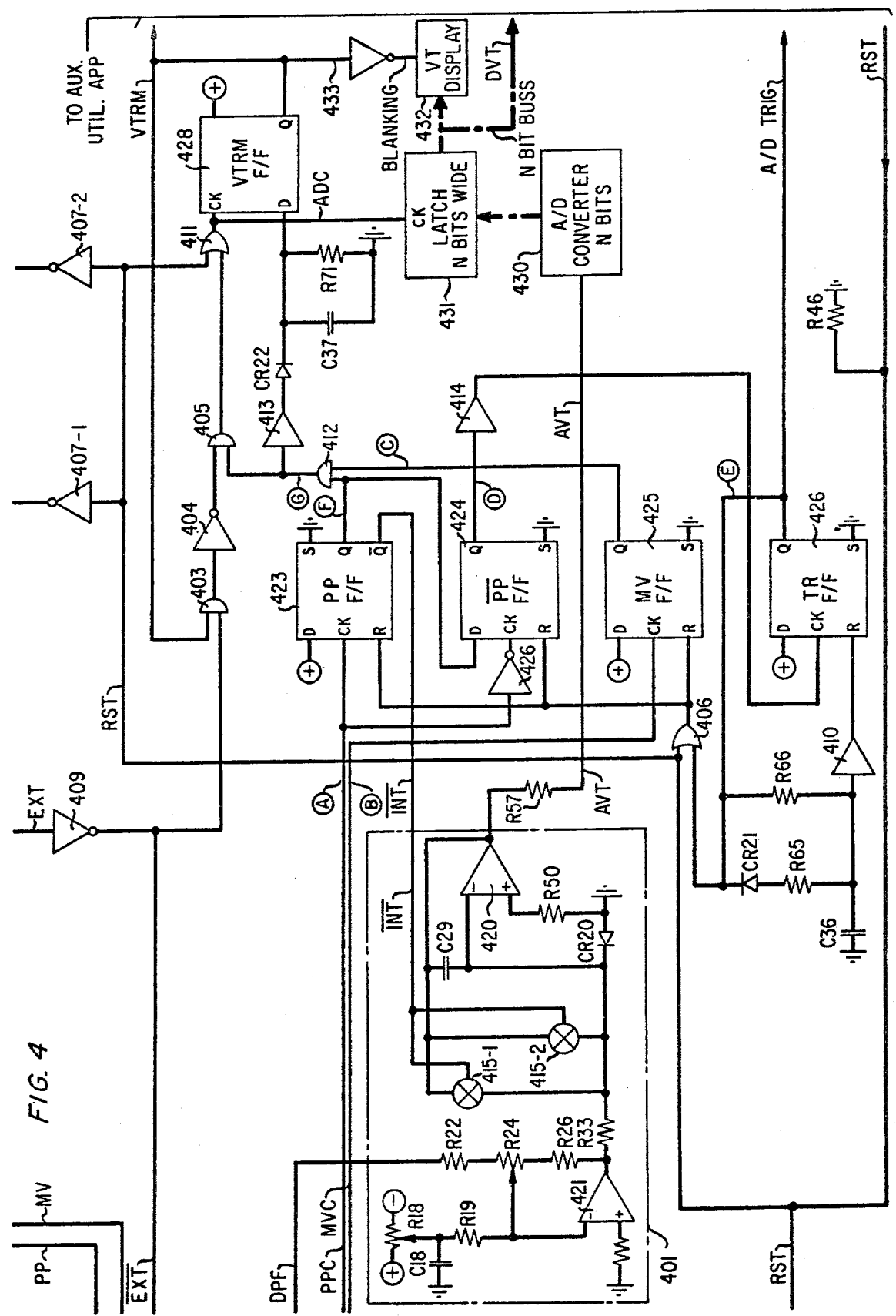
FIG. 4 shows the volt-seconds integrator.

The auxiliary utilization apparatus is required to provide merely two inputs, a continuous battery potential to lead EXT in the lower right-hand corner of FIG. 2 and a periodic reset signal to lead RST in the lower right-hand corner of FIG. 4. The function of the battery potential on lead EXT will be hereinafter described. Illustratively, the reset signal may be applied as a positive 2 microsecond pulse once every 32 milliseconds. The reset signal on lead RST is applied through inverters 407-1 and 407-2 to FIG. 2 to clear input latches 203 to 206 and output latches 209 through 212. The reset signal on lead RST is also applied through OR gate 406 to reset flip-flops 423 to 425.

The reset signal on lead RST is continued to the control terminal of IC gates 301-1 through 303-3, FIG. 3. The reset signal periodically enables these gates to apply the validation threshhold voltage $V_2$ to lead VPI thereby recharging capacitor C30, FIG. 1, to this level. The + input of buffer amplifier 122 in FIG. 1 is connected via resistor R52 to sense the potential to which capacitor C30 is charged and amplifier 122 at its output applies this voltage to lead VPO. Accordingly, prior to the arrival of any transient signal, the $V_2$ validation threshhold voltage that amplifier 22 applies to lead VPO is sensed at the lower input of comparator 326 in FIG. 3.

When (at time $t_1$ illustrated in FIG. 6) a voltage transient appears on lead DPF which exceeds the preliminary threshhold $V_1$ applied to the lower input of comparator 325, comparator 325 applies a "1" signal to lead PP. Driver amplifier 317PP applies a "1" signal to lead PPC which is continued into FIG. 4 to clock flip-flop 423. The "1" signal on lead PP is also continued into FIG. 2 and is applied through driver U14B to clock the input latch flip-flops 203 through 206.

After a delay interval determined by the RC time constant of either resistor R37 and R35 and the capacitance of capacitor C24, the transient signal appears on lead DPS. This transient signal is applied through resistor R47 and is A.C. coupled by capacitor C31 and resistor R62 and applied to the lower (−) input of operational amplifier 117.

If the transient magnitude appearing on lead DPS exceeds the voltage level appearing on lead VPO, comparator 326 (FIG. 3) places a "1" signal on lead MV. (See time $t_2$ in FIG. 5 and line B in FIG. 6.) The "1" signal on lead MV is continued to FIG. 2 where it is applied to the upper input of AND gate U12B. Assuming that the outputs of latches 203 to 206 and 209 to 212 have previously been cleared, NAND gate U19-3 will apply a high signal to the lower input of AND gate U12B allowing gate U12B to connect the "1" signal on lead MV to the lower input of AND gate U12C. If gate U12C is not blocked by a low signal from inverter U7C which is under the control of wide pulse error rejection circuit 208, the "1" signal on lead MV will clock output latches 209 to 212. The function of wide pulse error rejection circuit 208 will be described presently. Accordingly, it is seen that the states to which the flip-flops 203 to 206 of the input latch have each been set incident to the appearance of a "1" signal on lead PP are transferred to the corresponding flip-flops 209 to 212 of the output latch when a "1" signal appears on lead MV. The flip-flops 209 through 212 of the output latch energize leads RM, DIR, LOWI, and VPOL to the auxiliary utilization apparatus not shown and advantageously also to neon display bulbs (also not shown).

At the same time that the aforementioned transient impulse first appears on lead DPF, FIG. 1, it is also applied by lead DPF through FIG. 3 to integrating circuit 401, FIG. 4. The signal on lead DPF is applied via resistor R22 and a portion of potentiometer R24 to the inverting input of amplifier 421. Potentiometer resistor, R18 in series with R19 sets the offset voltage of this amplifier while the setting of Potentiometer R24 adjusts the gain to the desired value. When comparator 325 (FIG. 3) applies a "1" signal to lead PP driver 317PP continues the "1" signal to lead PPC in FIG. 4. The "1" signal on lead PPC is applied to the CK (clock) input of flip-flop 423 causing its Q output connected to lead F to go high and its $\overline{Q}$ output connected to lead $\overline{INT}$ to go low. When lead $\overline{INT}$ goes low, gates 415-1 and 415-2 which shunt capacitor C29 are open-circuited allowing capacitor C29 to be charged by the output of amplifier 420. Amplifier 421, responding to the input transient, drives inverting operational amplifier 420 which charges capacitor C29 in a manner that represents the time varying integration of the input transient. The output of amplifier 420 is coupled through resistor R57 to lead AVT which undergoes a rise in potential proportional to the integral of the voltage transient. The potential rise on lead AVT is, in other words, proportional to the volt-seconds area of the voltage transient curve. For digital output purposes, the analog voltage on lead AVT may be connected through analog-to-digital converter 430 and latches 431 to appear on digitally coded output bus DVT. Also, the information on bus DVT may be applied to a compatible digital display device 432. The display device may be blanked prior to the first valid transient by coupling the output of VTRM F/F 428 through inverter 433 to the blanking input of said display. Latch 431 operates as follows: when line ADC connected to its clock input is high the output data of the latch follows the input data, i.e., output=input. When line ACD subsequently goes to its low state, no further change in the latched output data takes place. A/D converter 430 may advantageously be of the "all-parallel" type. The conversion process is continuous in this type of converter so its digital output always reflects its analog input without initiation of any conversion process or sequence.

Timing of the impulse area integration process is accomplished by flip-flops 423 through 426 (FIG. 4) as follows. Waveforms at the various points labelled by encircled letters A through G in FIG. 4 are shown by FIG. 6. Time markers $t_1$ and $t_5$ correspond to similarly designated points in FIG. 5.

The integration of the voltage transient to compute its "volt-seconds" area is initiated by line PPC (FIG. 4) going high. This clocks F/F 423 causing its Q output to go high and its $\overline{Q}$ output to go low as previously discussed. The $\overline{Q}$ output, line $\overline{INT}$, being low allows the integration process to begin. The Q output (high) of F/F 423 is applied to the D input of F/F 424 and to the left input of AND gate 412. If the amplitude of the transient voltage pulse being integrated is greater than the validation threshhold, line MVC goes high as previously discussed and clocks F/F 425 causing its Q output to go to the high state. The Q output of F/F 425 is applied to the right input of AND gate 412. The output of gate 412 goes high since both its inputs are high and is applied to the input of driver 413 and the lower input of AND gate 405. The upper input of gate 405 is also high since line $\overline{EXT}$ is low. Gate 405 therefore transfers the high state to its output and applies it through OR gate 411 to the clock inputs of VTRM F/F 428 and latches 431. These devices are D-type flip-flops of the level triggered variety. In such devices the Q (data) outputs follow the state of the D inputs while the clock signal is high and do not change after the clock signal returns to its low state.

When the amplitude of the transient voltage pulse being integrated falls through threshhold level $V_1'$, line PPC goes low since, as hereinafter discussed, comparator 325 compares the voltage transient with the threshhold voltage $V_1'$ appearing on lead VPO. Line PPC is applied to the clock input of F/F 424 through inverter 426 causing the Q output of the flip-flop to go high since its D input has previously been set high by F/F 423. The Q output of F/F 424 is applied through driver 414 to the clock input of F/F 426. Driver 414 merely provides a slight propagation delay. A high state on the clock input of F/F 426 causes its Q output to go high.

This output is applied to the reset inputs of flip-flops 423 through 425 causing all their Q outputs to go low and $\overline{Q}$ outputs to go high. The $\overline{Q}$ output of F/F 423 places line $\overline{INT}$ in a high state ending the integration interval and discharging capacitor C29. Both inputs of gate 412 go low causing its output to go low which, transferred through gates 405 and 411, causes the clock input of F/F 428 to go low latching its output in the high state. The low output state of OR gate 411, applied to the clock input of latch 431 causes this latch to store its data last received from converter 430 but not to respond to any further input changes. Also, the Q output of F/F 426 is connected to its own reset input through a delay network comprised of R66 and C36 and buffer 410. Therefore, after a predetermined delay, illustratively 20 microseconds, F/F 426 resets itself as well to complete the pulse integration process.

With reference to FIG. 5, it is shown therein that, at an arbitrary time $t_0$, an illustrative, hypothetical transient is assumed to begin to exhibit a nonzero value. At some later arbitrary time designated $t_1$, the monitoring interval begins as the amplitude of the illustrative transient is shown having a value equaling that of the designated "initial" preliminary threshhold $V_1$. At this same time, likewise designated $t_1$ in FIG. 6, the "Pulse Present" line A depicts the signal level at the point circled "A" in FIG. 4 corresponding to the signal level on the "Pulse Present —PP" lead at the output of comparator 325, FIG. 3. At the arbitrarily later time $t_2$ within the monitoring interval, the illustrative transient has an amplitude equaling that of the designated initial user-set threshhold $V_2$. At this same time, likewise designated $t_2$ in FIG. 6, the "Meas. Valid" line B depicts the signal level at the point circled "B" in FIG. 4 corresponding to the signal level on the "measurement valid"-MV lead at the output of comparator 326, FIG. 3. Line C depicts the signal level at the output of MV flip-flop which output is immune to undulations that may be present in the signal level on line B.

At an arbitrarily later time designated $t_3$ within the monitoring interval, the illustrative transient exhibits its peak value $V_p$. Operational amplifier 127 continues charging capacitor C30 until that peak value appears at the slightly later time designated $t_4$.

It has thus far been assumed that a transient has occurred after the initial charging of capacitor C30 of FIG. 1 to the validation voltage level $V_2$. After the arrival of this first transient, capacitor C30 will have been charged by time $I_4$ in FIG. 5 to the peak value thereof. Let it now be assumed that another transient arrives before the next reset pulse is applied to lead RST. Capacitor C30 will have been charged to the peak value of the preceding transient and buffer amplifier 122 will be applying this voltage $V_p$ to lead VPO when the second transient arrives. Upon the arrival of the second transient, lead DPF will be energized and comparator 325 (FIG. 3) will have this transient applied to its upper terminal. The lower terminal of comparator 325 will now, however, be sensing a fraction of the voltage $V_p$ rather than merely the preliminary threshhold voltage $V_1$ since a fraction of the potential on lead VPO is applied to the lower terminal of comparator 325 by resistor R23, the fraction thereof being determined predominantly by the relative resistance of R23 to R20 in series with the parallel combination of R92 and R93. Accordingly, comparator 325 will not apply a "1" signal to lead PP unless the magnitude of this subsequent transient exceeds the enhanced preliminary threshhold level, $V_1'$ now established at the lower input of comparator 325. Likewise, comparator 326 which senses the difference in the potential between leads DPS and VPO will not apply a "1" signal to lead MV unless the potential on lead DPS occasioned by the arrival of the second transient exceeds the voltage $V_p$ on lead VPO (i.e., the second transient is greater than the first).

Accordingly, if a second transient exceeds the enhanced preliminary threshhold level $V_1'$, information concerning this transient will be clocked into the input latch, F/F 203 through 206. Additionally, if the second transient exceeds the peak value $V_p$ of the first transient, the new data will also be clocked into the output latch, F/F 209 through 212. If, however, the second transient rises above the level $V_1'$ which will cause comparator 325 to respond but does not exceed the voltage VP, comparator 326 will still not apply a "1" signal to lead MV. Thus, the information that may have been clocked into the input latch will not be transferred to the output latch. The relationship among preliminary threshhold voltage $V_1$, validation threshhold voltage $V_2$, the peak value of the transient $V_p$ and the enhanced preliminary threshhold $V_1'$ are shown in FIG. 5.

If still another transient occurs which exceeds the peak value $V_p$ of the first transient (or of any preceding transient since the last reset pulse on lead RST), comparator 325 will apply a "1" signal to lead PP and comparator 326 will apply a "1" signal to lead MV allowing the new current and voltage polarities to be entered into the input latch and transferred to the output latch circuitry of FIG. 2. In this case, the new values entered into the latches simply override the old values.

It has been stated before that the effects of a wide pulse having a time duration that exceeded the low pass band width limitations necessary to reject the basic mains frequency would also have to be rejected to prevent erroneous response. Circuit 208, FIG. 2, provides for this protection against wide transient pulse error. Comparator 117, FIG. 1, receives at its upper (+) input terminal a voltage $V_3$ which is a fraction of the voltage present on lead VPO. At its lower (−) input, comparator 117 receives the input transient on lead DPS a.c. coupled through capacitor C31. Comparator 117, accordingly, applies a negative-going signal to lead WPT whenever a transient signal appears on lead DPS exceeding threshhold voltage $V_3$. The magnitude of the transient to which comparator 117 responds is determined by the setting of variable resistor R59 which scales the value of the voltage appearing on lead VPO.

The signal applied to lead WPT is continued in FIG. 2 to the B input of one-shot circuit OSS and via resistor R63 inverter U19-1. The input to U19-1 is delayed slightly by resistor R63 and capacitor C22. This delay is required to prevent triggering of circuit OSL by the initial negative-going transient on line WPT as follows: When the negative-going WPT line triggers circuit OSS the Q output will go high causing the output of U7A to go low. If, however, the negative-going WPT line caused the output of U19-1 to go high before the output of U7A goes low, the output of U19-2 would momentarily go low triggering circuit OSL prematurely.

The B inputs of circuits OSS and OSL are normally maintained in the high signal state by resistors R67 and R70, respectively. Circuit OSS is controlled as to the duration of its mono-stable state by the selection of capacitor C34 and resistor R68. Circuit OSS is triggered by the low signal on lead WPT and, when triggered, maintains its Q output in the high signal state for a predetermined interval, illustratively, 50 microseconds.

When the transient signal sensed by comparator 117 terminates, it applies a high signal to lead WPT. This high signal has no effect with the B input of circuit OSS. The high signal on lead WPT is changed by inverter U19-1 to a low signal at the input of NAND gate U19-2, but this signal does not affect the pre-existing high signal at the output of gate U19-2. Circuit OSL therefore remains in its nontriggered state. The low signal condition of the Q output of circuit OSL is reflected by inverter U7C as a high signal applied to the upper input of AND gate U12C. Gate U12C is thus in condition to pass clock signals to the output latch flip-flops 209 through 212 when such signals are developed by the remainder of the circuitry of FIG. 2, heretofore described.

Upon the termination of the predetermined interval, the Q output of circuit OSS goes low and inverter U7A applies a high signal to the upper input of NAND gate U19-2. If, at this time, the transient signal is still being detected by comparator 117, lead WPT will still be in the low signal state and inverter U19-1 will still be applying a high signal to the lower input of NAND gate U19-2. NAND gate U19-2 will thus have high signals applied to both of its inputs and will, in turn, apply a low signal at the B input of one-shot circuit OSS, triggering circuit OSL to apply a high signal state at its Q output. The interval of circuit OSL's mono-stable operation is determined by the values of resistor R69 and capacitor C35 and, in the illustrative embodiment, is advantageously 4 milliseconds, or somewhat longer than the duration of disturbances typically caused by pulses wider than may be passed without significant distortion by the input filter circuits used in this embodiment of the invention.

During the interval of circuit OSL's mono-stable operation, output latches 209 through 212 are blocked at gate U12C from receiving any clock signals and so cannot deliver any data that will have been stored in input latches 203 to 206 to the auxiliary utilization apparatus (not shown).

It was mentioned above that the auxiliary utilization apparatus (not shown), in addition to providing the reset signal on lead RST, also provides battery on lead EXT. The battery (high signal) on lead EXT is reflected by inverter 409 in FIG. 4 as a low signal to block AND gate 403. The blocking of gate 403 prevents the Q output of VTRM flip-flop 428 from locking itself up after the flip-flop is clocked the first time.

If it is not desired to have flip-flop 428 in condition to accept a subsequent clock pulse through gate 412, battery (not shown) may be removed from lead EXT. When battery is removed from lead EXT, flip-flop 428 and latch 431 after having been set, will accept no subsequent data until after a reset signal (high on lead RST) has been applied.

Similarly, a high signal on lead EXT through inverter U7B places a low signal on the upper input of NAND gate U19-3 blocking the $\overline{Q}$ output of F/F 209 from inhibiting the passage of additional clock signals through AND gate U12B.

If it is not desired to have flip-flops 209 through 212 in condition to accept subsequent clock pulses through gate U12B, battery (not shown) may be removed from lead EXT. When battery is removed from lead EXT, flip-flops 209 through 212, after having been set, will accept no subsequent data until after a reset signal (high on lead RST) has been applied.

This feature allows for operation of the invention in a single measurement mode where data on the first pulse after reset is stored for an indefinite period until the reset signal is next applied.

An additional feature of this embodiment of the invention is to make provision for the convenient use of an external digital voltmeter (not shown) to read and display the peak voltage of the impulse being analyzed. Lead VPO, upper right corner of FIG. 3, may be connected to the signal input of said external digital voltmeter while the voltmeter may be triggered by the pulse provided on lead A/D TRIG, lower right side of FIG. 4.

While, as previously described, the illustrative embodiment is preferably to be used with an auxiliary recording apparatus of the type previously referred to there are shown at the right-hand portion of FIG. 2, an array of light emitting diodes D82, D84, D83, and D85 associated with the $\overline{Q}$ outputs of the flip-flops 209 through 212 constituting the output latch for providing an output display appropriate to the observed transients. Diode D82 will be illuminated when the output latch is clocked to indicate that an appropriate reading of transient voltage and polarity has been made. Diode D84 will be illuminated in the event that a voltage transient has been detected that is accompanied by a current transient whose amplitude is insufficient to warrant recording. Diode D85 will be illuminated when the polarity of the transient voltage detected is positive. Diode D83 will be illuminated when the transient impulse propagates from "SOURCE" to "LOAD" (see FIG. 1). If diode D82 is illuminated but diode D85 is not, the polarity of the transient voltage detected is negative. If diode D82 is illuminated but diode D83 is not, the direction of propagation of the impulse detected is from "LOAD" to "SOURCE" (see FIG. 1).

What has been described are the salient characteristics of one illustrative embodiment of the invention. Obvious modifications may be made by those skilled in the art to the component circuits such as to extend or alter the range of frequency, voltages, currents, etc., of the power lines on which transients are to be observed.

What is claimed is:

1. An arrangement for controlling the operation of transient integrator apparatus comprising:
   voltage integrating means,
   means for establishing the nominal voltage amplitude ($V_2$) of a transient disturbance whose volt-seconds area is to be accrued by said integrating means,
   means for initiating an ascertainment of said accruing volt-seconds area when said transient exhibits an initial amplitude ($V_1$) lower than said nominal amplitude ($V_2$),
   means for validating the ascertainment of said accruing volt-seconds area when said transient exhibits an amplitude equaling said nominal amplitude ($V_2$),
   means for enhancing said nominal amplitude ($V_2$) to a value ($V_2'$) in accordance with the peak value attained by said transient; and
   means for terminating said ascertainment of said accruing volt-seconds area when said transient exhibits an amplitude ($V_1'$) lower than said enhanced amplitude ($V_2'$) but higher than said initial amplitude ($V_1$).

2. An arrangement for controlling the operation of a transient voltage integrator to ascertain substantially the entire volt-seconds area accrued by a transient, comprising:
   threshold means for establishing a settable nominal voltage amplitude ($V_2$) of a transient disturbance whose volt-seconds area is to be accrued,
   means for initiating the operation of said voltage integrator when said transient disturbance exhibits an initial minimum amplitude ($V_1$) which is a fixed percentage of and lower than said nominal amplitude ($V_2$),
   means for ascertaining the peak value attained by said transient disturbance, and
   means controlled by said peak value ascertaining means for terminating the operation of said voltage integrator when said transient exhibits an amplitude substantially lower than said peak value but higher than said initial minimum amplitude ($V_1$) so as to accrue substantially the entire volt-seconds area of said transient while omitting therefrom ringing errors.

* * * * *